United States Patent [19]
Sanelli et al.

[11] Patent Number: 6,046,582
[45] Date of Patent: Apr. 4, 2000

[54] SELF-POWERED DIGITAL CLAMP METER

[75] Inventors: Ron Sanelli, Maspeth; Kismet Mohammed, Elmont, both of N.Y.

[73] Assignee: United Dominion Industries, Inc., Charlotte, N.C.

[21] Appl. No.: 09/126,300

[22] Filed: Jul. 30, 1998

[51] Int. Cl.[7] .............................. G01R 1/22; G01R 15/08
[52] U.S. Cl. ........................ 324/126; 324/115; 324/127
[58] Field of Search .................................. 324/127, 115, 324/117 R, 117 H, 119, 126, 131, 99 D

[56] References Cited

U.S. PATENT DOCUMENTS

| | | | |
|---|---|---|---|
| 2,724,821 | 11/1955 | Schweitzer, Jr. | 324/127 |
| 2,905,899 | 9/1959 | Miller et al. | 324/119 |
| 3,914,689 | 10/1975 | Wright | 324/119 |
| 4,074,193 | 2/1978 | Kohler | 324/126 |
| 4,132,981 | 1/1979 | White | 340/203 |
| 4,422,039 | 12/1983 | Davis | 324/119 |
| 4,438,396 | 3/1984 | Harnden, Jr. et al. | 324/115 |
| 4,831,327 | 5/1989 | Chenier et al. | 324/127 |
| 4,855,671 | 8/1989 | Fernandes | 324/127 |
| 5,157,708 | 10/1992 | Garthwaite et al. | 379/21 |
| 5,193,108 | 3/1993 | Stocklin | 379/21 |
| 5,373,412 | 12/1994 | Dousse | 361/93 |
| 5,446,372 | 8/1995 | Berkcan | 324/126 |
| 5,541,503 | 7/1996 | Berkcan et al. | 324/127 |
| 5,598,315 | 1/1997 | Phillips | 361/93 |

OTHER PUBLICATIONS

Harris Semiconductor, ICL7126 3½–Digit Low–Power Single–Chip A/D Converter, pp. 2–55–2–65, prior to Jul. 30, 1998.

*Primary Examiner*—Ernest Karlsen
*Attorney, Agent, or Firm*—Weingarten, Schurgin, Gagnebin & Hayes LLP

[57] ABSTRACT

A self-powered electrical clamp meter measures AC voltages in the range of 6 volts to 600 volts and AC currents in the range of 1 ampere to 300 amperes, and receives operating power from the source of the voltage or current being measured. The clamp meter employs first and second rectifier circuits. One rectifier generates rectified AC power from an AC voltage signal supplied by a voltage probe, and the other rectifier generates rectified AC power from an AC current signal supplied by a current probe. First and second regulator circuits generate regulated DC power from the rectified AC power, and corresponding scaling circuits generate first and second scaled voltage signals whose respective amplitudes are proportional to the output of the corresponding rectifier. A switch selects the first scaled voltage signal when a voltage is being measured, and the second scaled voltage signal when a current is being measured. An A/D converter converts the selected scaled voltage signal into a corresponding coded digital value that is displayed on a display along with an indication of whether the displayed value represents a voltage measurement or a current measurement. The switch, A/D converter, and display are low-power devices supplied with DC power from either the first or second regulator.

16 Claims, 5 Drawing Sheets

SELF-POWERED DIGITAL CLAMP METER

BACKGROUND OF THE INVENTION

The present invention is related to the field of electrical measurement instruments such as meters for measuring voltage and current.

Electrical measurement instruments are known that do not require an external source of power for their operation. For example, there are portable instruments intended to be used in environments having no conventional electrical source such as a wall outlet, or where a connection between the instrument to an electrical source would be inconvenient or even dangerous. One example of such an instrument is a hand-held clamp meter that can be used to measure the voltages and currents at various points within a power distribution system. Because of the size of such a system, it is more convenient for an electrical technician to use a portable, hand-held clamp meter rather than a meter that must be connected to an external source of electrical power.

It is very common for internally-powered instruments to be powered from batteries contained within the instrument. However, battery power has drawbacks that make it unattractive in some cases. Batteries wear out and require replacing or recharging. The instrument requires regular servicing to ensure proper battery operation, and a stock of batteries or a battery charger must be maintained. Thus battery-powered instruments have maintenance costs that add to their cost of ownership. And if the instrument is not serviced regularly, the instrument may not operate reliably, likewise resulting in increased cost to the owner or user.

Apart from battery-powered instruments, there have been instruments that draw operating power from a circuit being tested or measured. For example, U.S. Pat. No. 4,422,039 issued Dec. 20, 1983 to Lee A. Davis entitled "Self-Powered Ammeter" discloses an ammeter whose AC input current is measured and also provided to a regulator that produces power for the measurement circuitry. However, previous devices generally have been tailored to very specific uses. For example, the Davis ammeter is used only to measure currents, and thus is not ideally suited for use in environments where different types of measurements must be performed.

It is desirable to be able to measure electrical signals using an internally-powered measuring device that is inexpensive and reliable, and that may be used for multiple types of commonly-taken electrical measurements.

BRIEF SUMMARY OF THE INVENTION

In accordance with the present invention, an electrical measurement instrument is disclosed that measures both current and voltage in multiple ranges, and that receives operating power from the source of the voltage or current being measured. This flexible instrument provides the benefits of being internally powered without the costs and complications of using batteries as the source of power.

The disclosed measurement instrument employs a first rectifier circuit to generate rectified AC power from an AC voltage signal supplied to the instrument by a voltage probe. The amplitude of the rectified voltage is proportional to the amplitude of the supplied AC signal. A first regulator circuit generates regulated DC power from the rectified AC power from the first rectifier circuit, and a first scaling circuit generates a first scaled voltage signal whose amplitude is proportional to the amplitude of the rectified voltage generated by the first rectifier circuit.

The instrument further includes a second rectifier circuit to generate rectified AC power from an AC current signal supplied to the instrument by a current probe, the amplitude of the rectified current being proportional to the amplitude of the supplied AC current. A second regulator circuit generates regulated DC power from the rectified AC power generated by the second rectifier circuit, and a second scaling circuit generates a second scaled voltage signal whose amplitude is proportional to the amplitude of the rectified AC current generated by the second rectifier circuit.

A switch is used to select either the first or second scaled voltage signal to be used for the desired measurement. The first scaled voltage signal is selected when a voltage is being measured, and the second scaled voltage signal is selected when a current is being measured. An A/D converter converts the selected scaled voltage signal into a corresponding coded digital value that is displayed on a display along with an indication of whether the displayed value represents a voltage measurement or a current measurement. The switch, A/D converter, and display are supplied with DC power from either the first or second regulator. These devices are designed to draw as little power as possible so that their effect on the accuracy of the measurement is negligible.

In a preferred embodiment, the instrument is designed to measure the relatively high voltages and currents found in a power distribution system, such as voltages between 6 volts and 600 volts AC and currents between 1 ampere and 300 amperes AC. The rectifier, regulator, and scaling circuits are designed to enable accurate and reliable measurement over these ranges.

Other aspects, features, and advantages of the present invention are disclosed in the detailed description which follows.

DETAILED DESCRIPTION OF THE INVENTION

Figures 1, 1A:
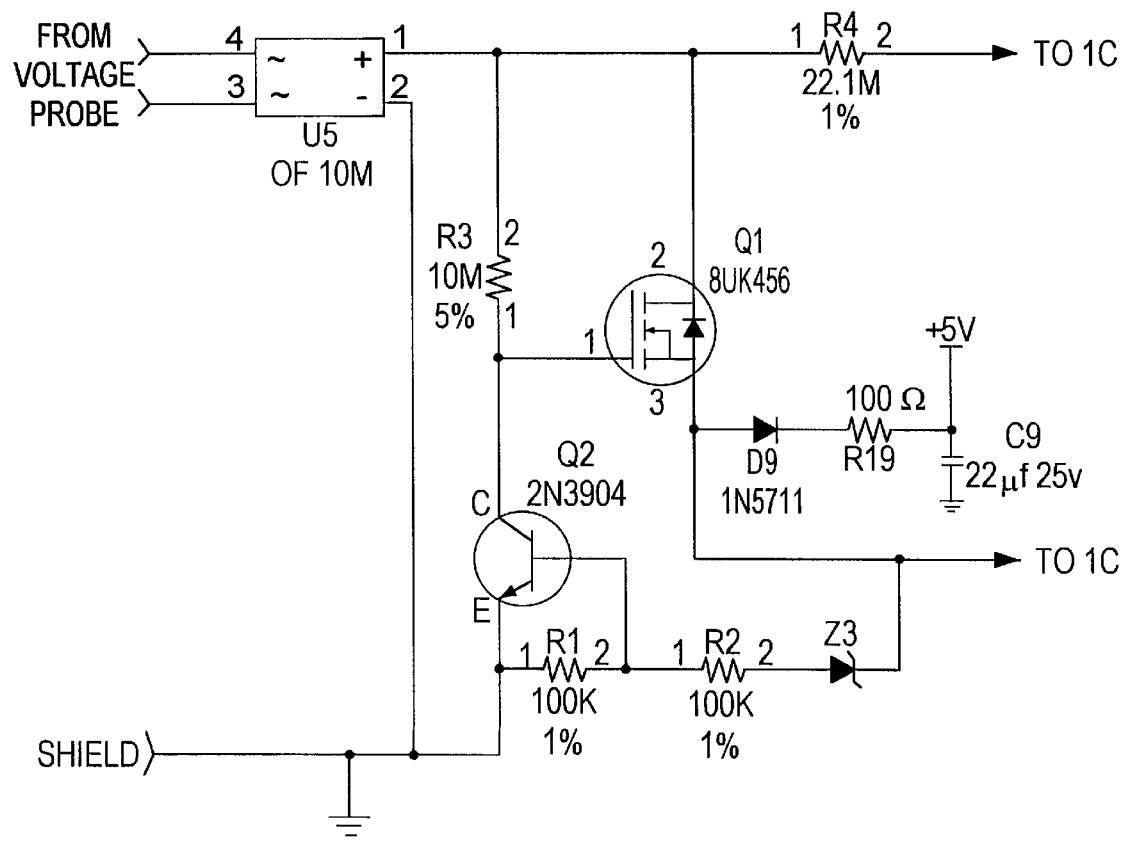
FIG. 1, which consists of FIGS. 1A–1E, is a schematic diagram of a self-powered clamp meter circuit according to the principles of the present invention.

FIG. 1 shows a self-powered clamp meter circuit that operates from power supplied by either a voltage probe during a voltage measurement or by a current probe during a current measurement. The circuit measures current over the range of 1 to 300 amperes, and voltage over the range of 6 to 600 volts. The circuit uses low-power integrated circuits in order to minimize loading on the signal being measured. It has been experimentally determined that the current supplied through the +5 volt supply node (+5V) is approximately 50 microamperes.

Figure 1B:
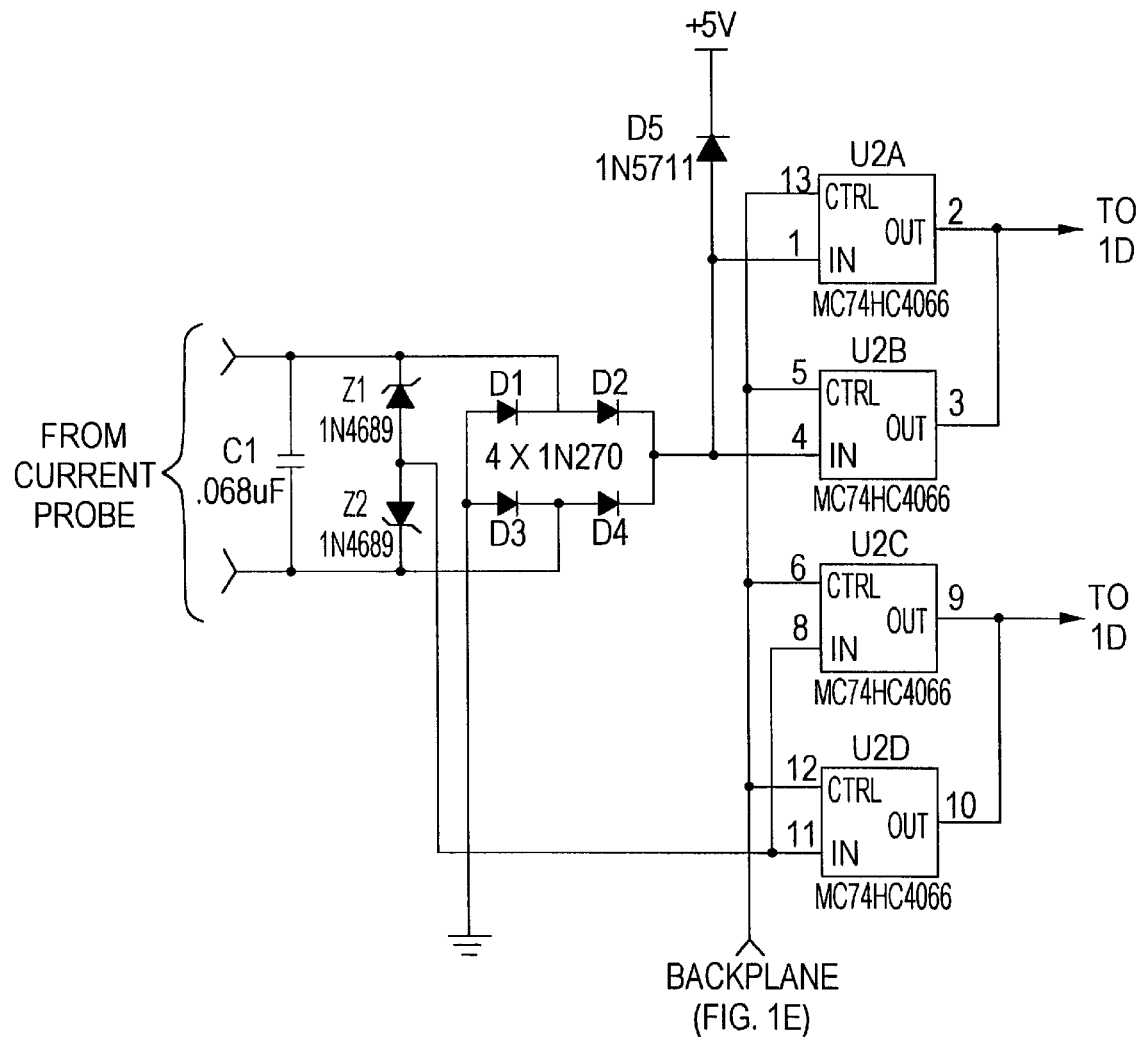

For current measurements, an inductive current probe having a nickel-iron core is preferably used. A 60-Hz resonant circuit is formed by the inductance of the current probe and a capacitor C1 (FIG. 1B) to maximize the power available to the circuit for operation. The current probe output is full-wave rectified by a diode bridge circuit consisting of diodes D1–D4. The diodes D1–D4 are preferably germanium diodes, so that power losses arising from the diodes' forward voltage drop and reverse leakage are minimized. A diode D5 is used to allow current to flow from the bridge circuit into a +5v supply node from which other circuit components are powered. Zener diodes Z1 and Z2 operate to clamp the voltage applied to the bridge circuit at 5 volts, which is the desired operating voltage of the circuit.

As discussed in greater detail below, this clamping action of the diodes Z1 and Z2 occurs during a phase of circuit operation in which the current probe input is used to provide operating power. During another phase in which the input is used to obtain a current measurement, the voltage across diodes Z1 and Z2 is sufficiently small so that they do not conduct.

Figure 1C:
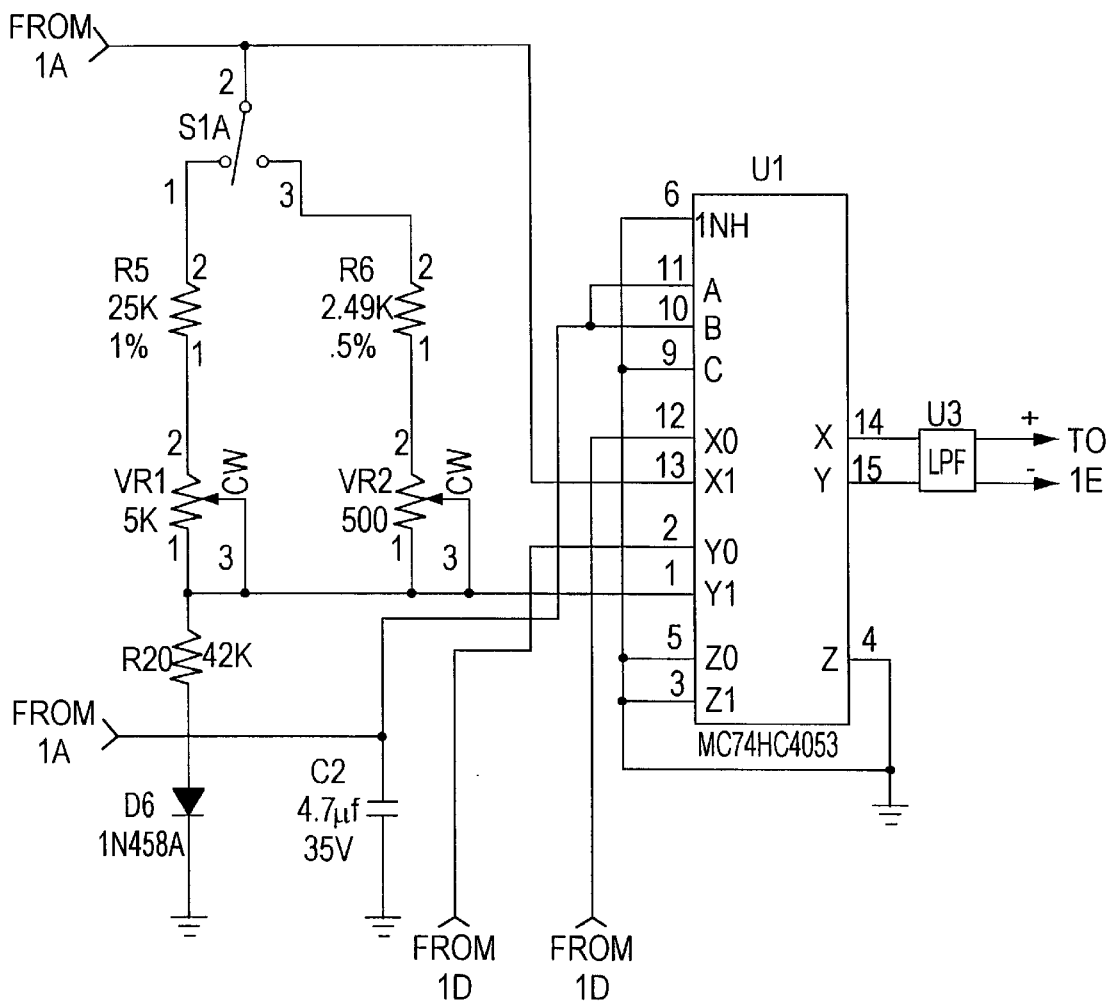
Figure 1D:
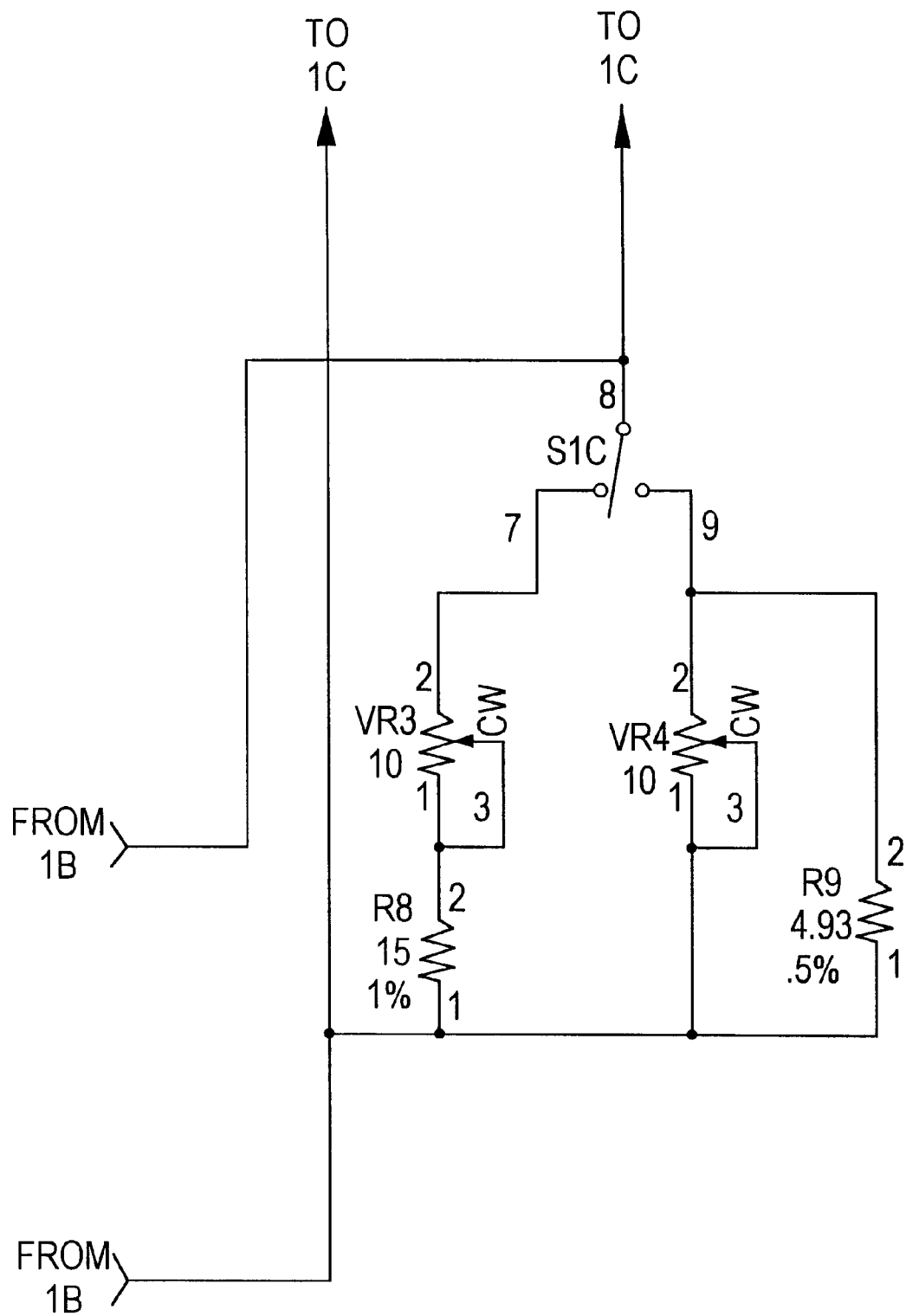

An analog switch U2 (consisting of switches U2A–U2D, FIG. 1B) is used to intermittently connect the rectified current probe input signal to a load circuit consisting of fixed resistors R8 and R9 and variable resistors VR3 and VR4 (FIG. 1D). The switches are arranged in two pairs, U2A–U2B and U2C–U2D. The switches in each pair are connected in parallel in order to reduce series resistance. In the load circuit, a user-controlled switch S1C selects either a high-range load consisting of R9 and VR4, or a low-range load consisting of R8 and VR3. Currents between 1 ampere and 300 amperes are measured in the high range, and currents between 1.0 ampere and 199.9 amperes are measured in the low range.

Figure 1E:
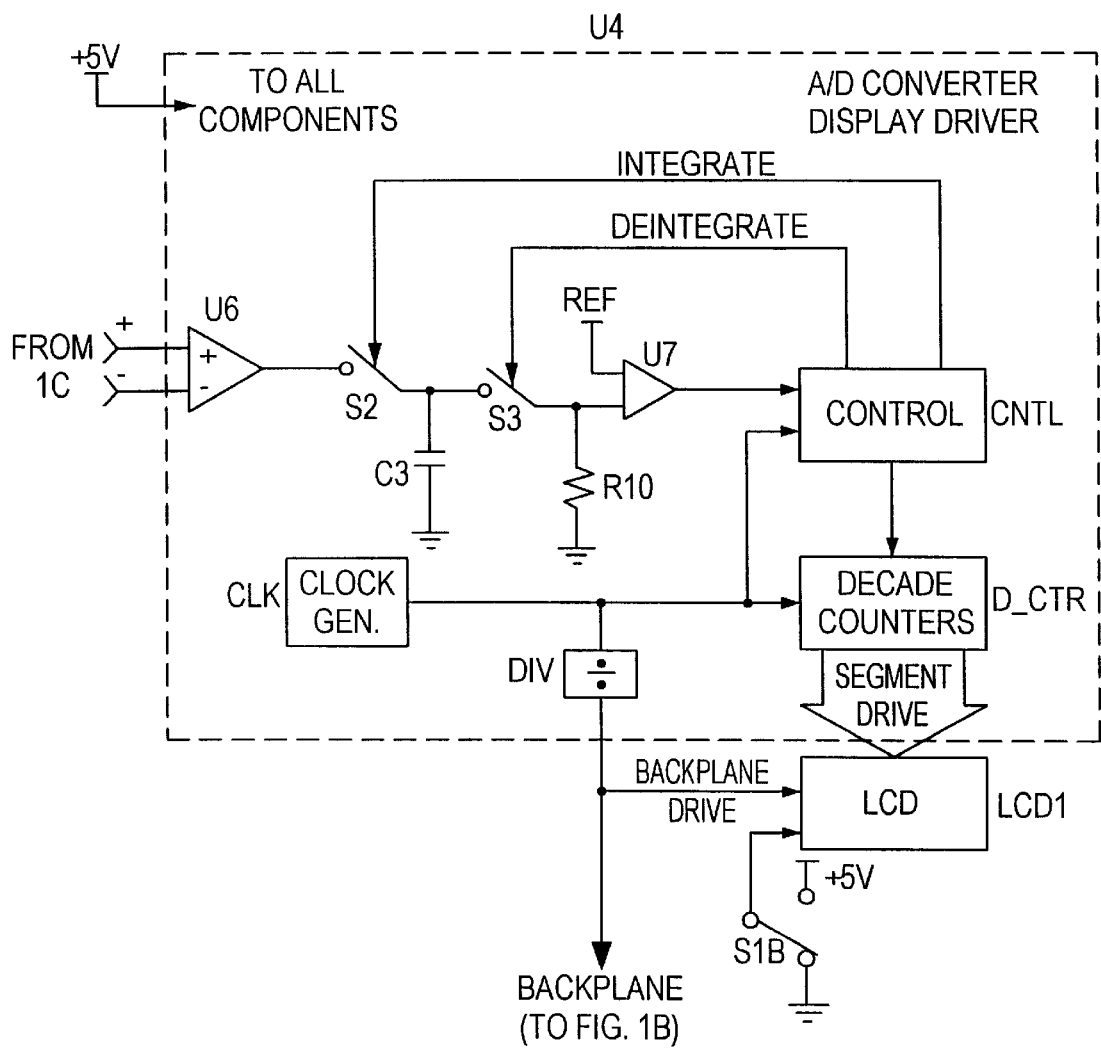

The switch U2 enables the current probe input to provide power 50% of the time and to provide a current measurement the other 50% of the time. The switching of U2 is controlled by a low-frequency (15 Hz) square-wave signal BACKPLANE generated by an LCD IC (FIG. 1E). When the switch U2 is open, the AC voltage across the current probe builds up until clamped by diodes Z1 and Z2. The clamped signal is rectified by the D1–D4 bridge circuit, and the rectified signal provides supply current via diode D5 and the +5V supply node. A capacitor C9 filters ripple. When the switch U2 is closed, the load created by either R8-VR3 or R9-VR4 is connected across the switch outputs, and hence is effectively connected across the current probe terminals. The current probe voltage is reduced to a small value, approximately 1 millivolt per measured ampere. The small-signal outputs from the switch U2 are provided to measurement circuitry (FIGS. 1C, 1E) described in greater detail below.

For voltage measurements, the input from a voltage probe is rectified in a full-wave rectifier U5 (FIG. 1A). The output of the rectifier U5 is supplied to a regulator circuit that provides 5 volts DC to the +5V node. The regulator includes high-voltage MOSFET Q1, bipolar junction transistor Q2, 5-volt zener diode Z3, and resistors R1, R2, and R3. The regulator maintains a voltage of approximately 6 volts at the gate of MOSFET Q1, regardless of the variable voltage at the output (pin 1) of the rectifier U5. Q1 provides charge to the +5V supply node through its source terminal (pin 3), diode D9, and resistor R19.

A voltage divider network is used to reduce the rectified voltage from U5 to a corresponding value used by the measurement circuitry. The divider includes resistor R4 (FIG. 1A), resistor R20 and diode D8 (FIG. 1C), and a range-dependent network consisting of either resistor R5 and variable resistor VR1 or resistor R6 and variable resistor VR2. A user-controlled range switch S1A selects the appropriate network. Voltages between 6 volts and 600 volts are measured in the high range; voltages between 6.0 volts and 199.9 volts are measured in the low range.

The resistor R20 and diode D8 perform two desirable functions. First, they maintain the average level of the signal being measured at approximately 1.5 volts, which is desirable to obtain precise operation of the measurement circuitry. Also, the diodes correct for nonlinearities that exist when the circuit is operating in the low voltage range.

The voltage and current signals used for measurement are provided to another switch U1 whose switching action is controlled by the signal appearing on the source terminal of the MOSFET Q1 (FIG. 1A), which is filtered by a capacitor C2 to reduce noise. This configuration provides what is referred to as an "automode" feature, because the switch U1 automatically connects the correct signals to its outputs depending on the type of measurement being made. When a current measurement is being made, the source of Q1 is a logic "low". Accordingly, switch U1 connects inputs X0 and Y0, on which the current signals appear, to its outputs X and Y respectively. When a voltage measurement is being made, the source of Q1 is a logic "high", so inputs X1 and Y1, on which the voltage signals appear, are connected to the X and Y outputs.

The X and Y outputs from the switch U1 are filtered by a low-pass filter U3. This filter suppresses noise caused by the switching of U2.

A low-power 3½-digit A/D converter and display driver U4 (FIG. 1E) provides the functions of converting the differential analog signal from the filter U3 into a digital value, and driving an LCD panel LCD1 to display the digital value. The A/D converter U4 is available as a single integrated circuit known by the product name ICL 7126 manufactured by Harris Semiconductor, Inc. FIG. 1E is intended to describe the functionality of the ICL 7126 at a high level; it does not necessarily represent actual circuit components that exist on the ICL 7126. The LCD panel LCD1 has a 2-segment most-significant digit (to display a "1") and three less-significant 7-segment digits, as well as indicators for polarity, decimal point, and measurement type (voltage or current). The decimal point is controlled by a range switch S1B. The display is refreshed upon each assertion of the BACKPLANE signal according to the state of the segment drive signals from U4.

The circuitry within U4 receives DC power via the +5V supply node, which is supplied from the regulator MOSFET Q1 during a voltage measurement and from the rectified current probe input during a current measurement as described above.

A clock generator CLK is used to generate a clock signal in the range of 12–50 Khz that is used as a time base. The circuit's operations are controlled by control logic CNTL. A measurement is taken periodically, for example from one to three times per second. In one phase of each measurement, the differential signal provided to U6 is integrated by switch S2 and capacitor C3. In a subsequent phase, the integrated value is "de-integrated", or discharged, by switch S3 and resistor R10. A comparator U7 indicates when the value has crossed a predetermined reference threshold REF. The decade counters D_CTR are started at the beginning of de-integration, and their output is latched when the output of U7 becomes asserted. The latch outputs are provided to the display LCD1 as segment drive signals, which act in concert with the low-frequency BACKPLANE signal to display the appropriate value on the display LCD1.

The display LCD1 receives its operating power from the segment and backplane drive signals provided by the A/D converter U4. Because U4 is in turn powered by the +5V supply node, in effect the display receives its operating power from the +5v node. Thus the circuitry shown in FIG. 1E is powered from either the voltage probe or current probe during the corresponding measurement. In alternative embodiments, the display may be connected directly to the supply node to receive operating power.

A self-powered digital clamp meter has been described herein. It will be apparent to those skilled in the art that modifications to and variations of the above-described apparatus are possible without departing from the inventive concepts disclosed herein. Accordingly, the invention should be viewed as limited solely by the scope and spirit of the appended claims.

What is claimed is:

1. An electrical measuring instrument, comprising:
   a first rectifier circuit operative to generate rectified AC power from AC power supplied to the instrument by a voltage probe;
   a first regulator circuit operative to provide regulated DC power from the rectified AC power generated by the first rectifier circuit;
   a first scaling circuit operative to generate a first scaled voltage signal whose amplitude is proportional to the amplitude of the rectified voltage generated by the first rectifier circuit;
   a second rectifier circuit operative to generate rectified AC power from AC power supplied to the instrument by a current probe;
   a second regulator circuit operative to provide regulated DC power from the rectified AC power generated by the second rectifier circuit;
   a second scaling circuit operative to generate a second scaled voltage signal whose amplitude is proportional to the amplitude of the rectified current generated by the second rectifier circuit;
   a switch operative to select either the first or second scaled voltage signal, the first scaled voltage signal being selected when the instrument is used to measure a voltage, and the second scaled voltage signal being selected when the instrument is used to measure a current;
   an A/D converter powerable by either the first or second regulator circuit, the A/D converter being operative to convert the scaled voltage signal selected by the switch a corresponding coded digital value; and
   a display powerable by either the first or second regulator circuit, the display being operative to display the coded digital value from the A/D converter and an indication of whether the displayed value represents a voltage measurement or a current measurement.

2. An instrument according to claim 1, further comprising a second switch, the second switch being operative to select either a low range or a high range of operation of the instrument, and wherein (i) the scaling circuits are operative to provide different scaling of the respective rectifier output signals depending on which range of operation is selected, and (ii) the display is operative to display the coded digital value with a different decimal point location depending on which range of operation is selected.

3. An instrument according to claim 1, wherein the switch is an electronic switch powerable by either the first or second regulator circuit, the switch being controlled by a signal from the first rectifier indicating whether a voltage measurement is in progress.

4. An instrument according to claim 1, further comprising two diodes, each diode connecting the output of a corresponding regulator circuit to a DC supply node, and wherein the A/D converter and the display receive operating power via the DC supply node.

5. An instrument according to claim 1, further comprising:
   a second switch, the second switch being an electronic switch and being operative in one position to connect the output of the second rectifier circuit to the second scaling circuit and operative in another position to disconnect the output of the second rectifier circuit from the second scaling circuit; and
   a signal generator operative to generate a periodic binary control signal to control the second switch.

6. An instrument according to claim 5, wherein the duty cycle of the binary control signal is approximately 50%.

7. An instrument according to claim 1, wherein the first regulator comprises:
   a power MOSFET connected between the output of the first rectifier circuit and the output of the first regulator;
   a variable voltage divider connected between the output of the first rectifier and ground, the voltage divider having a control input and also having an intermediate node connected to the gate of the power MOSFET; and
   a zener diode connected between the output of the regulator and the control input of the voltage divider, the zener diode being operative in conjunction with the voltage divider to maintain a predetermined voltage at the gate of the MOSFET over a range of voltages appearing at the output of the first rectifier.

8. An instrument according to claim 7, wherein the voltage divider network comprises:
   a resistor connected between the output of the first rectifier circuit and the gate of the power MOSFET; and
   a transistor connected between the gate of the power MOSFET and ground, the transistor having a conduction-controlling terminal to which the zener diode is coupled.

9. An instrument according to claim 8, wherein the transistor is a bipolar junction transistor and the conduction-controlling terminal is the base terminal thereof.

10. An instrument according to claim 1, wherein the second regulator comprises a pair of zener diodes connected back-to-back across the terminals of the current probe.

11. An electrical measuring instrument, comprising:
   a first full-wave rectifier circuit operative to generate rectified AC power from AC power supplied to the instrument by a voltage probe;
   a regulator operative to provide regulated DC power from the rectified AC power generated by the first rectifier circuit, the output of the regulator being diode-connected to a DC supply node via which regulated DC power is provided to circuit components connected thereto;
   a first scaling circuit operative to generate a first scaled voltage signal whose amplitude is proportional to the amplitude of the rectified voltage generated by the first rectifier circuit;
   a second full-wave rectifier circuit operative to generate rectified AC power from AC power supplied to the instrument by a current probe, the output of the second full-wave rectifier circuit being diode-connected to the DC supply node;
   a pair of zener diodes connected back-to-back across the terminals of the current probe;
   a second scaling circuit operative when connected to the second rectifier circuit to generate a second scaled voltage signal whose amplitude is proportional to the amplitude of the rectified current generated by the second rectifier circuit;
   a first electronic switch powered from the DC supply node, the first switch being operative in one position to connect the output of the second rectifier circuit to the second scaling circuit and operative in another position to disconnect the output of the second rectifier circuit from the second scaling circuit;

a signal generator operative to generate a periodic binary control signal to control the first switch;

a second switch, the second switch being operative to select either the first or second scaled voltage signal, the first scaled voltage signal being selected when the instrument is used to measure a voltage, and the second scaled voltage signal being selected when the instrument is used to measure a current;

an A/D converter powered from the DC supply node, the A/D converter being operative to convert the scaled voltage signal selected by the second switch into a corresponding coded digital value; and a display powered from the DC supply node, the display being operative to display the coded digital value from the A/D converter and an indication of whether the displayed value represents a voltage measurement or a current measurement.

12. An instrument according to claim 11, wherein the second switch is an electronic switch powered from the DC supply node, the second switch being controlled by a signal from the regulator indicating whether a voltage measurement is in progress.

13. An instrument according to claim 11, further comprising a third switch operative to select either a low range or a high range of operation of the instrument, and wherein (i) the scaling circuits are operative to provide different scaling of the respective rectifier output signals depending on which range of operation is selected, and (ii) the display is operative to display the coded digital value with a different decimal point location depending on which range of operation is selected.

14. An instrument according to claim 11, wherein the regulator comprises:

a power MOSFET connected between the output of the first rectifier circuit and the output of the regulator;

a variable voltage divider connected between the output of the first rectifier and ground, the voltage divider having a control input and also having an intermediate node connected to the gate of the power MOSFET; and a zener diode connected between the output of the regulator and the control input of the voltage divider, the zener diode being operative in conjunction with the voltage divider to maintain a predetermined voltage at the gate of the MOSFET over a range of voltages appearing at the output of the first rectifier.

15. An instrument according to claim 14, wherein the voltage divider network comprises:

a resistor connected between the output of the first rectifier circuit and the gate of the power MOSFET; and a transistor connected between the gate of the power MOSFET and ground, the transistor having a conduction-controlling terminal to which the zener diode is coupled.

16. An instrument according to claim 15, wherein the transistor is a bipolar junction transistor and the conduction-controlling terminal is the base terminal thereof.

* * * * *